(12) United States Patent
Fu et al.

(10) Patent No.: US 12,323,852 B2
(45) Date of Patent: Jun. 3, 2025

(54) REDUCING NETWORK TRAFFIC

(71) Applicant: Telefonaktiebolaget LM Ericsson (publ), Stockholm (SE)

(72) Inventors: Zhang Fu, Stockholm (SE); Peiliang Chang, Åkersberga (SE); Yifei Jin, Solna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 634 days.

(21) Appl. No.: 17/633,393

(22) PCT Filed: Jul. 1, 2020

(86) PCT No.: PCT/SE2020/050689
§ 371 (c)(1),
(2) Date: Feb. 7, 2022

(87) PCT Pub. No.: WO2021/025605
PCT Pub. Date: Feb. 11, 2021

(65) Prior Publication Data
US 2022/0295346 A1    Sep. 15, 2022

Related U.S. Application Data

(60) Provisional application No. 62/884,223, filed on Aug. 8, 2019.

(51) Int. Cl.
*H04W 28/06* (2009.01)
*H04L 1/00* (2006.01)
*H04W 28/04* (2009.01)

(52) U.S. Cl.
CPC .......... *H04W 28/06* (2013.01); *H04L 1/0042* (2013.01); *H04L 1/0076* (2013.01); *H04W 28/04* (2013.01)

(58) Field of Classification Search
CPC .... H04W 28/06; H04W 28/04; H04L 1/0042; H04L 1/0076; H04L 69/04; H04B 1/66;
(Continued)

(56) References Cited

U.S. PATENT DOCUMENTS 5,701,302 A    12/1997  Geiger
7,564,861 B1    7/2009  Subbiah
(Continued)

FOREIGN PATENT DOCUMENTS

CN        110475243 A  *  11/2019
EP        3072330 A1      9/2016
(Continued)

OTHER PUBLICATIONS

Translated CN110475243A (Year: 2018).*
(Continued)

*Primary Examiner* — Jung Liu
(74) *Attorney, Agent, or Firm* — Rothwell, Figg, Ernst & Manbeck, P.C.

(57) ABSTRACT

A Data Compression Manager (DCM) that can help a data provider (DP) and a data consumer (DC) to establish a data transfer using an advantageous data compression method. In one embodiment, when a DC wants to get some data from a DC, the DP will contact the DCM and the DCM will then choose data compression information based on (i.e., based at least on), for example, current conditions within the network (e.g., a maximum available network bandwidth), information about the data to be compressed (e.g., the type of the data), and/or the DC's data error tolerance. Then the DCM will indicate to the DP the chosen data compression information. The DP will then i) inform the DC of the compression information that is needed by the DC to decompress the data and ii) provide the requested data to the DC in compressed form.

20 Claims, 10 Drawing Sheets

(58) Field of Classification Search
CPC . H03M 7/3059; H03M 7/6094; H03M 7/6064
See application file for complete search history.

(56) References Cited

U.S. PATENT DOCUMENTS

| | | |
|---|---|---|
| 8,327,026 B1 | 12/2012 | Tripathi et al. |
| 8,417,833 B1 | 4/2013 | Amdahl |
| 2003/0224734 A1 | 12/2003 | Takekawa et al. |
| 2013/0297575 A1 | 11/2013 | Fallon et al. |
| 2016/0314140 A1 | 10/2016 | Gupta |
| 2020/0389813 A1* | 12/2020 | Hande .................... H04W 8/04 |

FOREIGN PATENT DOCUMENTS

| | | |
|---|---|---|
| WO | 2010/017749 A1 | 2/2010 |
| WO | 2019/042912 A1 | 3/2019 |

OTHER PUBLICATIONS

International Search Report and Written Opinion dated Dec. 30, 2020 in International Application No. PCT/SE2020/050689 (9 pages total).

3GPP TS 23.502 V16.1.0, Jun. 2019, 3rd Generation Partnership Project; Technical Specification Group Services and System Aspects; Procedures for the 5G System; Stage 2 (Release 16) (500 pages total).

3GPP TS 23.501 V16.1.0, Jun. 2019, 3rd Generation Partnership Project; Technical Specification Group Services and System Aspects; System Architecture for the 5G System; Stage 2 (Release 16) (368 pages total).

* cited by examiner

REDUCING NETWORK TRAFFIC

CROSS REFERENCE TO RELATED APPLICATION(S)

This application is a 35 U.S.C. § 371 National Stage of International Patent Application No. PCT/SE2020/050689, filed Jul. 1, 2020, which claims priority to U.S. provisional application No. 62/884,223, filed on Aug. 8, 2019. The above identified applications are incorporated by reference.

TECHNICAL FIELD

This disclosure relates to reducing the amount of network traffic in a network.

BACKGROUND

The 5G system architecture leverages service-based interactions between control plane (CP) network functions (NFs). In the 5G system, an NF may expose its abilities as services that can be used by other NFs. For example, the Access and Mobility Management Function (AMF) can provide a service that enables another NF to communicate through the AMF with a user equipment (UE) and/or an access network (AN). Similarly, a Session Management Function (SMF) exposes service that allows another NF to handle protocol data unit (PDU) sessions.

An NF exposes its services by registering with a NF Repository Function (NRF). In addition to registration services, the NRF also offers service discovery to enable NFs to find each other. An SMF uses the N4 interface to talk to user plane functions (UPFs) to setup user plane traffic states as well as get traffic monitoring results from the UPFs.

Data Exposure

There are three types of data exposures in the 5G core network.

1. Data exposure among NFs. Such data exposure is usually done via a publish/subscribe paradigm. For example, an AMF provides the Namf_EventExposure service, which can expose UE access and mobility events, e.g., location changes, access type changes, connectivity state changes, etc. A consumer of the Namf_EventExposure service can use the Namf_EventExposure_Subscribe message to subscribe to a specific event, and it can use Namf_EventExposure_UnSubscribe message to unsubscribe from the corresponding event. The service provider (in this case, an AMF instance) uses Namf_EventExposure_Notify message to send an event to the service consumer.

2. Data exposure from core network to third party application functions (AFs). Such data exposure is currently indicating the monitoring ability of Network Exposure Function (NEF). Monitoring capability is comprised of means that allow the identification of the 5G network function suitable for configuring specific monitoring events, detection of monitoring events, and reporting the monitoring events to the authorized external party. Monitoring capability can be used for exposing UE's mobility management context such as UE location, reachability, roaming status, and loss of connectivity.

3. Data exposure from UPFs to the control plane. This kind of data exposure is done via the N4 interface between SMF and UPF. UPFs can report usage data and traffic statistics to an SMF for further usage, e.g. the SMF provides such data to a charging system or to an analytical functions (such as Network Data Analytics Functions (NWDAF)) for intelligent management of 5G system.

Data Compression

Generally, a data compression is one of two types: lossless and lossy. Lossless compression typically refers to compression algorithms which apply data coding. By using lossless compression, the data that was compressed can be completely reconstructed at the receiving end. Lossless compression, such as Huffman coding, arithmetic coding, and Shannon-Fano encoding are very popular. Lossless compression focusses on efficient coding of each information unit and it is very suitable for compressing text-based data.

Lossy compression techniques focus on reducing data volume by approximating data and reducing the number of data points that need to be transferred. In this case, the compression ratio can be adjusted by the trade-off between information loss and expected data volume. Accepting information loss can lead to saving storage space and transmitting less data. Lossy compression techniques (e.g., Piecewise Linear Approximation (PLA) and Piecewise Aggregate Approximation (PAA)) can significantly reduce data size, which can be advantageous when a large amount of data (e.g., time series data) needs to be transferred from the provider of the data ("data provider") to a consumer of the data ("data consumer").

Machine Learning

Machine learning (ML) models have been widely applied to prediction problems including real-time series analysis, object tracing, and similar problems. Some typical models tackling prediction problem include: K Nearest Neighbor (KNN), random forest, Recurrent Neural Network (RNN), etc.

KNN can be used for both classification and regression, and the prediction outcome is determined by the K nearest neighbors of the predicted object in the feature space. For the case of classification, all K nearest neighbors will vote the object to belong to their own class and the object will finally be classified into the most voted class. For the case of regression, the regressed value of the predicted object can be determined by taking average of the K neighbors' value.

Random forest is an ensemble approach, which could be applied to both classification and regression problem. It is based on (i.e., based at least on) averaging the results of an ensemble of decision trees and trained on different parts of the same training set to reduce variance.

Logistic regression method is another approach for solving classification problems. The main idea of this approach is to model the log-likelihood of the classification outputs as linear functions of the inputs. The model coefficients are estimated by maximizing the log-likelihood of the observed outputs in the training data. This method has an advantage of robustness, although its accuracy might not be as high as other approaches, such as neural network.

RNN is a regression process, which use neural network method and take both the output from previous time step and current time step input. It is used to capture the relation in a time series between time steps. The output of latter time step will refer the knowledge from previous time step and its current time step input. More technique like Gated Recurrent Unit (GRU) and Long-Short-Term Memory (LSTM) can be applied for tuning the length of previous time step result referred in prediction.

SUMMARY

Certain challenges exist. For example, because data analytics and machine learning are key drivers in the 5G system, it is expected that data consuming functions will request large amounts of data from data providing functions. Such large data transfers, however, can be a significant burden not only on the transportation network itself, but also to the corresponding data providing and data consuming functions. Current 3GPP specifications define RESTful APIs using JSON as the data format for inter-NF communications. These RESTful APIs, however, may be not efficient at transferring a large JSON object because the APIs typically do not leverage the advantage of data compression and coding to save network resources and energy. For example, consider a machine learning application needs to obtain user position and traffic statistic data every 10 seconds for every user in the network. If the network contains 10 million users, then there are at least 2 million signals per seconds in the system, no mention of other signals for many other types of events, e.g., registration, handover, PDU session updates, etc.

Generally, for the lossy compression of a machine learning data set from which a prediction will be made, there is a trade-off between the compression ratio and the prediction accuracy. That is, typically a higher compression ratio of the data set leads to a lower prediction accuracy because data is lost during the compression process. Nevertheless, some machine learning algorithms can tolerate some levels of data loss. That is, even if some data is lost, the machine learning algorithms can still predict an outcome with an acceptable degree of accuracy.

This disclosure proposes a new network function, which is called the Data Compression Manager (DCM) that can help a data provider (DP) and a data consumer (DC) to establish a data transfer using an advantageous data compression method. In one embodiment, when a DC wants to get some data from a DP, the DP will contact the DCM and the DCM will then choose data compression information based on (i.e., based at least on), for example, current conditions within the network (e.g., a maximum available network bandwidth), information about the data to be compressed (e.g., the type of the data), and/or the DC's data error tolerance. Then the DCM will indicate to the DP the chosen data compression information. The DP will then i) inform the DC of the compression information that is needed by the DC to decompress the data and ii) provide the requested data to the DC in compressed form.

An advantage of this architecture is that the DCM can intelligently select compression information so that data volume is reduced yet the consumer can still have high performance (e.g., the consumer can still generate accurate enough predictions).

According to some embodiments, there is provided a method for reducing network traffic in a communication system comprising a data consumer, a data provider, and a network connecting the data consumer with the data provider. The method comprises the data consumer transmitting, via the network, to the data provider a data request comprising data set identification information identifying a requested data set. The method also comprises after transmitting the information to the data provider, the data consumer receiving a message comprising data decompression information selected by a data compression manager (DCM) based on error bound information that identifies an error bound, information about the requested data set, and/or information included in a query response from a management function. The DCM may be separate from the data consumer. The method further comprises the data consumer receiving compressed data generated by the data provider using data compression information selected by the DCM. The compressed data may comprise a compressed version of the requested data set, and the data compression information may be selected by the DCM based on the error bound, the information about the requested data set, and/or the information included in the query response from the management function. The method further comprises the data consumer decompressing the received compressed data using the data decompression information selected by the DCM.

According to some embodiments, there is provided a method for reducing network traffic in a communication system comprising a data consumer, a data provider, and a network connecting the data consumer with the data provider. The method comprises the data provider receiving a first request transmitted by the data consumer, the request comprising data set identification information identifying a requested data set. The method also comprises after receiving the first request, the data provider obtaining data compression information based on error bound information identifying an error bound, information about the requested data set, and/or information included in a query response from a management function. The method further comprises after obtaining the data compression information, the data provider compressing the requested data set using the received data compression information, thereby producing compressed data. The method further comprises the data provider transmitting, via the network, to the data consumer the compressed data.

According to some embodiments, there is provided a method for reducing network traffic in a communication system comprising a data consumer, a data provider, a network connecting the data consumer with the data provider, and a data compression manager, DCM. The method comprises the DCM receiving a compression information request (CIR) transmitted by the data provider or the data consumer. The CIR may comprise at least i) error bound information identifying an error bound or ii) information about a data set requested by the data consumer. The method further comprises in response to receiving the CIR, the DCM selecting first data compression information based on the error bound information, the information about the requested data set, and/or information included in a query response from a management function. The method further comprises the DCM providing the selected first data compression information to the data provider or the data consumer.

In another aspect there is provided a computer program comprising instructions which when executed by processing circuitry causes the processing circuitry to perform any of the methods disclosed herein.

In another aspect there is provided a carrier containing the computer program disclosed herein. The carrier may be one of an electronic signal, an optical signal, a radio signal, and a computer readable storage medium.

In another aspect there is provided an apparatus being configured to perform any of the methods disclosed herein.

According to some embodiments, there is provided a data consumer. The data consumer comprises a transmitting unit for transmitting, via a network, to a data provider a data request comprising: i) data set identification information identifying a requested data set and ii) error bound information identifying an error bound. The data consumer also comprises a message receiving unit for receiving a message comprising data decompression information selected by a data compression manager (DCM) based on the error bound. The DCM may be separate from the data consumer. The data consumer further comprises a compressed data receiving unit for receiving compressed data generated by the data provider using data compression information selected by the DCM. The compressed data may comprise a compressed version of the requested data set, and the data compression information may be selected by the DCM based on the error bound. The data consumer further comprises a decompressing unit for decompressing the received compressed data using the data decompression information selected by the DCM.

According to some embodiments, there is provided a data provider. The data provider comprises a receiving unit for receiving a first request transmitted by the data consumer, the request comprising: i) data set identification information identifying a requested data set and ii) error bound information identifying an error bound. The data provider also comprises an obtaining unit for obtaining data compression information based on the error bound information. The data provider further comprises a compressing unit for compressing the requested data set using the received data compression information, thereby producing compressed data. The data provider further comprises a transmitting unit for transmitting, via the network, to the data consumer the compressed data.

According to some embodiments, there is provided a data compression manager (DCM). The DCM comprises a receiving unit for receiving a compression information request (CIR) transmitted by the data provider or the data consumer. The CIR may comprise at least one of i) error bound information identifying an error bound or ii) information about a data set requested by the data consumer. The DCM also comprises a selecting unit for selecting, in response to receiving the CIR, first data compression information based on the error bound information and/or the information about the requested data set. The DCM further comprises a providing unit for providing the selected first data compression information to the data provider or the data consumer.

DETAILED DESCRIPTION

Figure 1:
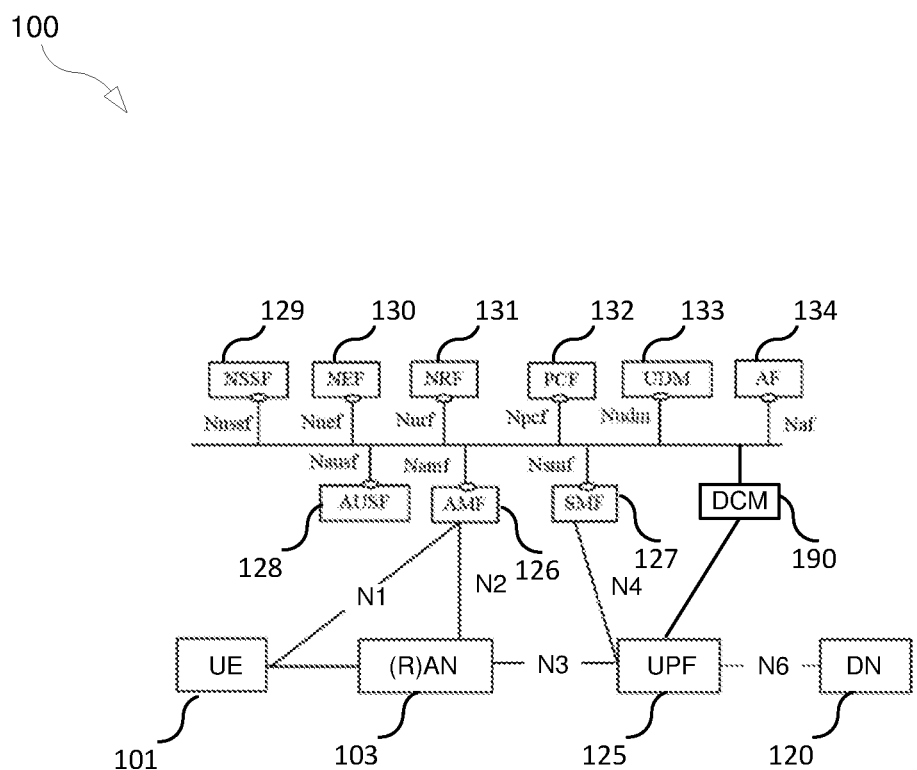
FIG. 1 depicts a reference architecture of a 5G communications system.

FIG. 1 depicts a reference architecture of a communications system 100 according to one embodiment. In the example shown, system 100 is a 5G system. More specifically, FIG. 1 depicts a UE 101 that is connected to an access network (AN) 103, which may be a radio access network (RAN). AN 103 is connected to an Access and Mobility Management Function (AMF) 126 via a N2 reference point and the AN is also connected to a User plane Function (UPF) 125 via an N3 reference point. UPF 125 is adapted to be connected to a Session Management Function (SMF) 127 via a N4 reference point and is adapted to be connected to a data network (DN) 120 via a N6 reference point. The DN may be, for example, operator services, Internet access or 3rd party services. UE 101 is also connected to AMF 126 via a N1 reference point. As further shown in FIG. 1, system 100 further includes the following additional network functions: an Authentication Server Function (AUSF) 128, a Network Slice Selection Function (NSSF) 129, a Network Exposure Function (NEF) 130, a NRF 131, a Policy Control function (PCF) 132, a Unified Data Management (UDM) 133, and an Application Function (AF) 134. Each of the network functions 126-134 exhibits a service based interface. For example, the service based interface exhibited by the NSSF 129 is referred to as "Nnssf". Similarly, the service based interface exhibited by AMF 126 is referred to as "Namf".

UE 101 may be any communication device, mobile or stationary, enabled to communicate over a wireless channel (e.g., radio channel) with an access point of an AN (e.g., a base station). For instance, UE 101 may be a mobile phone, smart phone, sensor, meter, vehicle, appliance (household, medical, etc.), media player, camera, Machine to Machine (M2M) device or any type of consumer electronic devices, for instance but not limited to television, radio, lighting arrangements, tablet computer, laptop or Personal Computer (PC). UE 101 may be portable, pocket storable, hand held, computer comprised, or vehicle mounted, and may be enabled to communicate voice and/or data, via the radio access network, with another entity, such as another UE or a server. The AN 103 may comprise an access point (not shown in FIG. 1) such as a NodeB, an eNodeB, a gNB, a Wi-Fi access point, or any other access point capable to communicate over a radio carrier with the UE 101. The abbreviations AN and RAN may be used interchangeably. The AN may include both a 3GPP radio access network and a non-3GPP access network. A typical non-3GPP access network is a Wi-Fi network.

The Data Compression Manager

In the embodiment shown in FIG. 1, communication system 100 also includes a data compression manager (DCM) 190. The DCM 190 functions to choose compression information to be used by a data provider (e.g., a first network function) and a data consumer (e.g., a second network function). For example, DCM 190 may choose compression information based on (i.e., based at least on) conditions within system 100, the type of data that the data consumer is requesting from the data provider, and/or a specified compression accuracy error bound.

Figure 2:
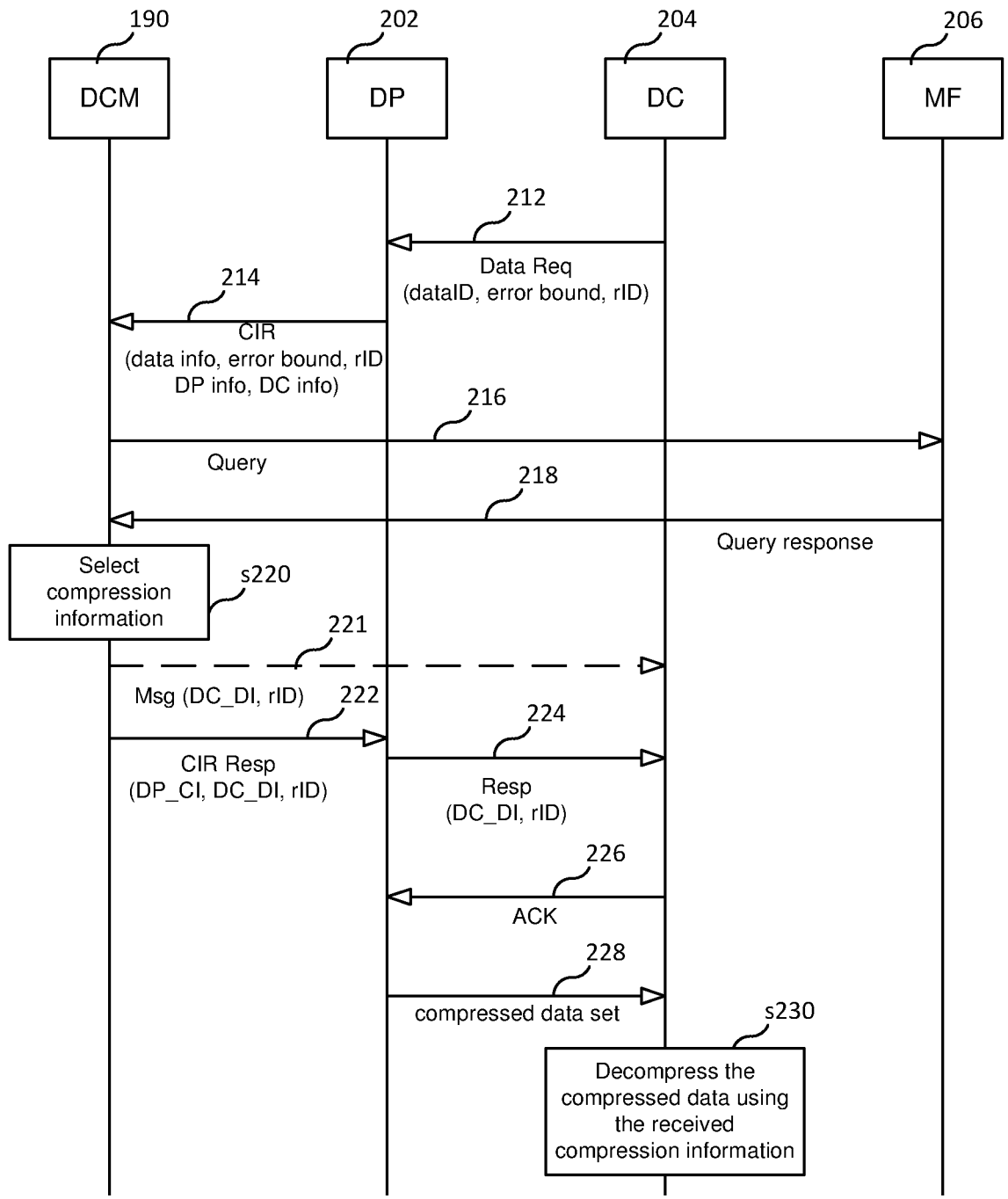
FIG. 2 is a message flow diagram illustrating a message flow according to some embodiments.

FIG. 2 illustrate a message flow among DCM 190, a data provider (DP) 202, and data consumer (DC) 204. DP 202 may be an NF (e.g., a 5G core network user plane NF) or an AF. Similarly, DC 204 may be an NF (e.g., a 5G core network control plane NF) or an AF. Each of DCM 190, DP 202, and DC 204 may be implemented as a software component and they may run on the same or different physical machines. For example, in one embodiment, the DCM 190 and DP 202 run on the same physical machine, but execute within different virtual machines (VMs) running on the physical machine. In another embodiment, DCM 190 and DP 202 are executed by the same VM. In another embodiment, the DCM 190 is a component of DP 202. Likewise, DP 202 and DC 204 may run on the same physical machine, but execute within different VMs.

As shown in FIG. 2, DC 204 sends a data request (Req) 212 to DP 202. The request 212 includes data set identification information (dataID) identifying a requested data set that DC 204 would like to obtain from DP 202. Request 212 may further include error bound information identifying an error bound. Here we assume that the DC 204 knows what error bound its application can tolerate, e.g., 1%, 5% error. Regarding some error sensitive applications, the error bound could be 0, so that lossless compression must be used. Request 212 may further include a request identifier (rID) that is uniquely associated with request 212. This rID may be needed in case DC 204 sends multiple different data requests to DP 202.

In response to receiving data request 212, DP 204 provides to DCM 190 a compression information request (CIR) 214. In one embodiment, CIR 214 includes the error bound information that was included in the data request 212 and/or information about the requested data set. In one embodiment, the information about the requested data set comprises or consists of a sample of the requested data set (e.g., a randomly selected sample of 2% of the data set). In some embodiments, CIR 214 may further include information about the DP 202 and/or information about DC 204. For example, the information about DP/DC 202/204 may include information that identifies the type of network function (e.g., AMF, SMF, UPF) that DP/DC implements.

After receiving CIR 214, DCM 190 may query a manager function (MF) 206 for network status information (e.g., information regarding the status of the network link(s) between DP 202 and DC 204) and/or service level agreement (SLA) information. Accordingly, MF 206 may be or include an Operations, Administration, and Management (OAM) server and/or an SLA manager. In one embodiment, DCM 190 uses the information obtained from MF 206 to determine the maximum amount of network resources that can be used for the requested data transfer. For example, the SLA may define that for DC 204 at most N megabits per second (Mbps) can be used for the data transfer (N being greater than 0). DCM 190 may also check how much network resource is available to use for the data transfer. For example, the information received from MF 206 may comprise network resource information that indicates a maximum available network bandwidth. That is, for example, the network resource information indicates that a maximum of M Mbps is available for the data transfer. In such a scenario, M Mbps is the determined maximum amount of network resources (e.g., network bandwidth) that can be used for the requested data transfer. Accordingly, as shown in FIG. 2, DCM 190 may transmit a query 216 (e.g., an SLA query and/or a network status query) to MF 206 and MF 206 responds to the query by transmitting a query response 218 containing the requested information—e.g., containing network resource information indicating one or both of i) an SLA network bandwidth limit (e.g., N Mbps) and ii) information indicating a maximum network bandwidth available for a data transfer between DP 202 and DC 204 (i.e., M Mbps).

In step s220, DCM 190 uses information contained in CIR 214 and/or information contained in query response 218 to select compression information (CI). In one embodiment, the selected compression information includes: i) DP compression information (DP_CI) (i.e., compression information that may be used by DP 204 to compress the requested data set) and ii) DC decompression information (DC_DI) (i.e., compression information that is needed by DC 204 to decompress compressed data generated by DP 202 using the DP compression information). After selecting the compression information, DCM 190 transmits a response 222 to the CIR 214. The CIR response 222 in one embodiment includes the compression information that was selected by DCM 190 in step s220 or a portion thereof. For example, as illustrated in FIG. 2, in one embodiment, CIR response 222 includes both the DP compression information (DP_CI) and the DC decompression information (DC_DI). However, in other embodiments, CIR response 222 may only include the DP_CI. In embodiments in which CIR response does not include the DC decompression information (DC_DI), DCM 190 may transmit to DC 204 a message 221 that includes the DC_DI, as illustrated by the dashed line in FIG. 2. This message 221 may also include the rID that was included in the CIR 214 so that when DC 204 receives message 221, DC 204 can correlate the message 221 to data request 212, and thereby use the DC_DI to decompress the compressed version of the requested data set. In one embodiment, to enable DCM 190 to transmit the DC_DI to DC 204, a network address allocated to DC 204 may be included in CIR 214. Thus, in such an embodiment, DCM 190 transmits the DC_DI to DC 204 by transmitting the message to the network address included in CIR 214.

In one embodiment, based on the error bound and the corresponding compression ratio with different compression methods, DCM 190 can estimate the network bandwidth requirement for the requested data transfer. Then, in step s220, based on the estimated network bandwidth requirement and the determined maximum amount of network resources that can be used for the requested data transfer, DCM 190 determines whether the estimated network bandwidth requirement can be met. For example, in the example above, DCM 190 has determined that the maximum network bandwidth that can be used for the requested data transfer is M Mbps. Accordingly, for example, if DCM 190 determines that the network bandwidth requirement for the requested data transfer is greater than M Mbps, then DCM 190 will determine that the estimated network bandwidth requirement cannot be met. Otherwise, if DCM 190 determines that the network bandwidth requirement for the requested data transfer is less than or equal to M Mbps, then DCM 190 will determine that the estimated network bandwidth requirement can be met. Assuming the estimated network bandwidth requirement can be met, then DCM 190 will provide to DP 202 the selected compression information (or at least the selected DP compression information (DP_CI)), otherwise, DCM 190 will reject this data transfer request by sending a rejection to DP 202, which then can be forwarded to DC 204. If the request is rejected, DC 204 can issue a new request with a new error bound or try later when the network has more resources available.

In one embodiment, DCM 190 maintains information about relations between error bounds and compression ratios of different types of data sets in the system. This can be done by either offline configuration or online training. Some possible implementation of DCM could include: (1) using decision tree to manage relation between error bound and compression ratio offline and perform compression decision in runtime through the decision tree model; (2) using KNN to cluster the received error rate requirement from service consumer and perform compression decision based on the voting of several most likely empirical records in runtime; (3) using neural net, trained from historical data, to classify the received requirement by DCM and perform compression decision based on the output likelihood of meeting the required requirement; (4) using other ML models to simulate the relation between error bound and compression ratio and provide prediction.

In one embodiment, as noted above, the compression information provided to DP 202 (see Resp 222) includes i) DP compression information (i.e., information to enable DC 204 to compress the requested data set and ii) DC decompression information (i.e., information to enable DC 204 to decompress the compressed data produced by DP 202). DP 202 then transmits to DC 204 a response (Resp) 224, which is responsive to request 212. In embodiments in which DCM 190 does not send message 221 to DC 204, response 224 transmitted by DP 202 includes at least some of the compression information received from DCM 190 (e.g., response 224 includes the DC decompression information (DC_DI)). After receiving response 224, DC 204 transmits to DP 202 an ACK 226, which indicates that DC 204 wants to continue with the data transfer procedure. In response to the ACK 226, DP 202 compresses the requested data set using the compression information selected by DCM 190 (e.g., the DP compression information), thereby creating compressed data 228, and then transmits the compressed data 228 to DC 204. DC 204 then uses the compression information selected by DCM (e.g., the DC decompression information) to decompress the compressed data 228 (step s230), thereby producing uncompressed data. If a lossless compression algorithm was used by DC 204, then the uncompressed data will be identical to the requested data set (assuming an error free connection, such as a TCP connection, between DP 202 and DC 204), otherwise the uncompressed data may have errors due to the lossy compression algorithm, but the error rate should be less than or equal to the error bound.

In one embodiment, the compression information selected by DCM 109 and provided to DP 202 includes: information identifying a selected compression algorithm, a set of one or more compression parameters for the selected compression algorithm, software for compressing the data set in accordance with the selected compression algorithm, and/or software for decompressing the data set in accordance with the selected compression algorithm.

As illustrated in the above paragraph, there are multiple alternatives of what compression information is provided by DCM 190 to DP 202. For example, in one embodiment, if both DP 202 and DC 204 have implemented different types of data compression algorithms, then DCM need only provide some compression parameters to DP 202. For example, regarding PLA, DCM can give error bound parameter and maximum number of data points modelled by one line in PLA. Regarding lossless compression (e.g., Huffman coding), DCM can provide the dictionary for coding. In another embodiment, if DP 202 and DC 204 have not implemented the selected compression algorithm, then DCM 190 will provide software (e.g., executable binary software, source code, and/or scripts) to them for data transferring. All necessary compression parameters can be included in the software, so that all that DP 202 and DC 204 need to do is plugin the software as an adapter to the data sending and receiving endpoints.

Example 5G Use Cases

Figure 3:
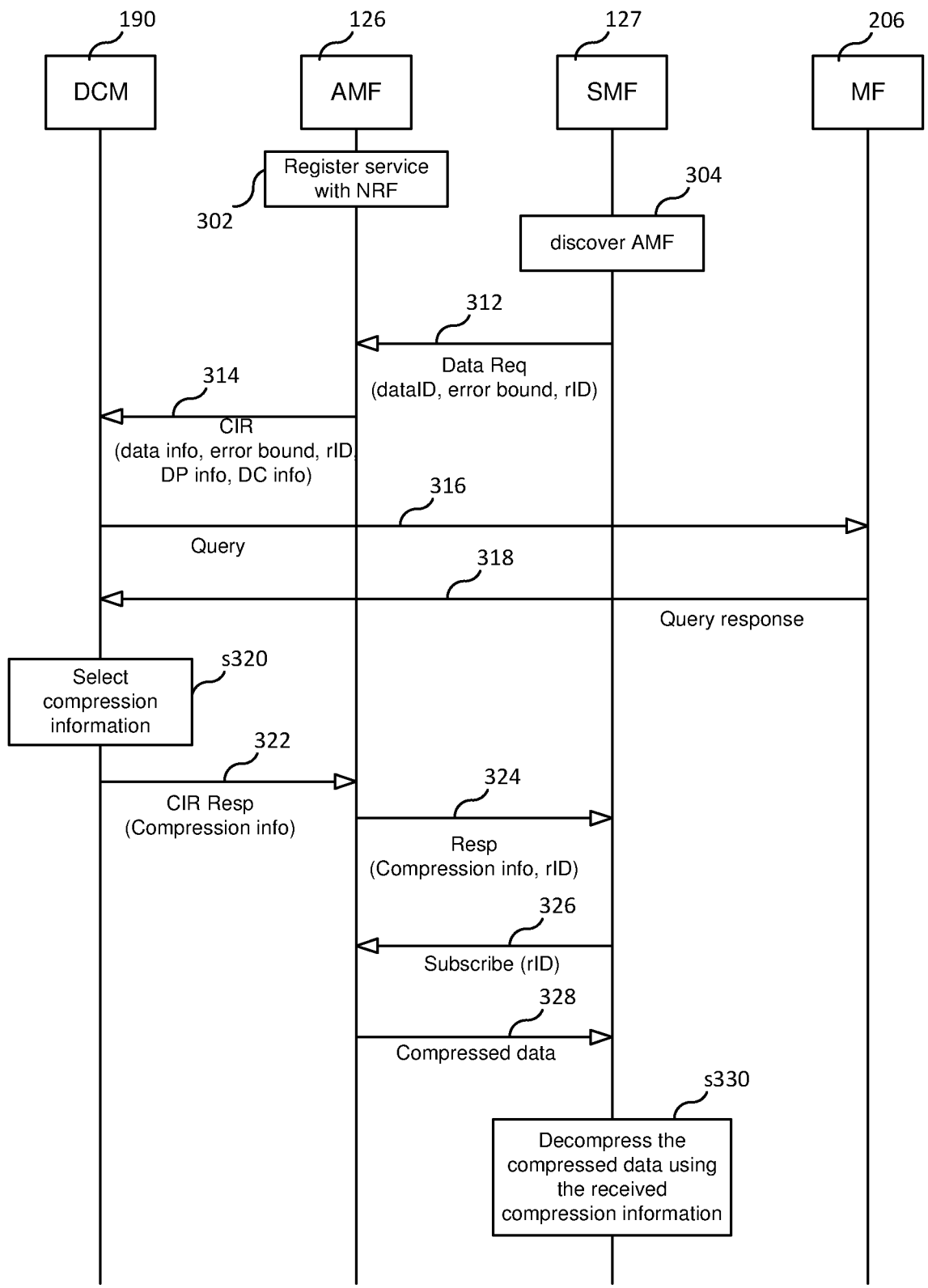
FIG. 3 is a message flow diagram illustrating a message flow according to some embodiments.
Figure 4:
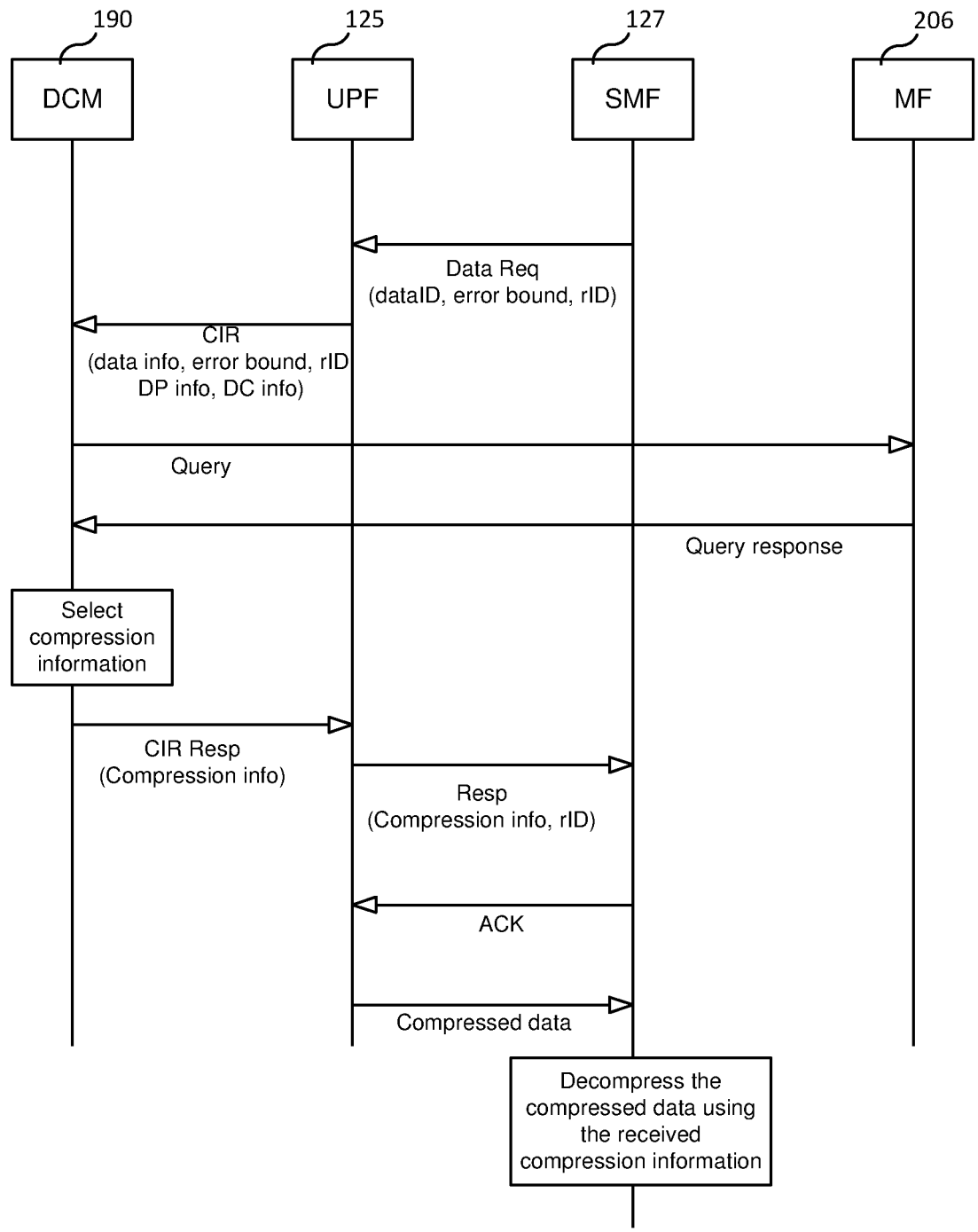
FIG. 4 is a message flow diagram illustrating a message flow according to some embodiments.
Figure 5:
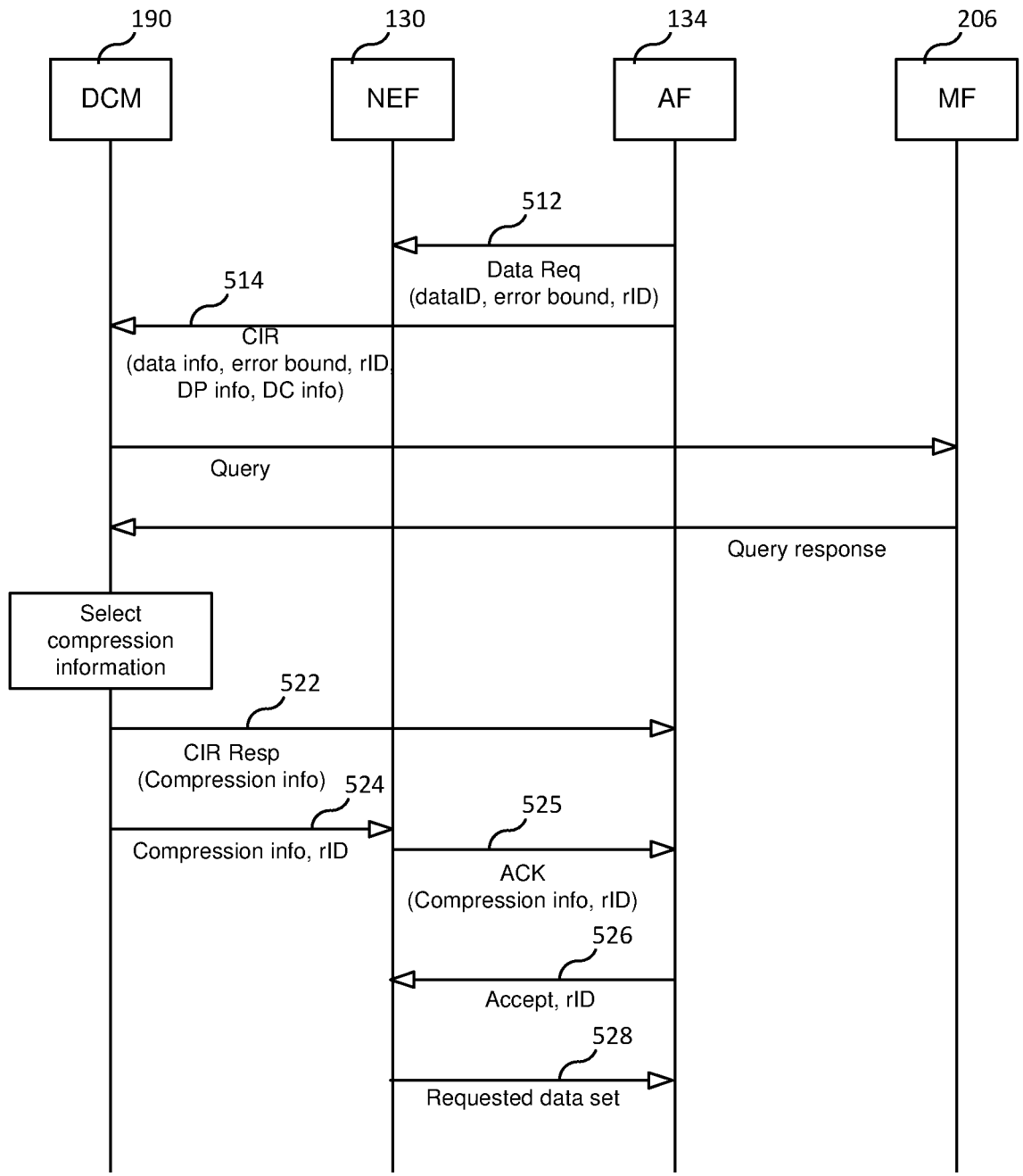
FIG. 5 is a message flow diagram illustrating a message flow according to some embodiments.

Three example 5G uses cases are illustrated (see FIG. 3, FIG. 4, and FIG. 5). The examples follow three types of data exposures mentioned above. Example 1 (FIG. 3) is data transfer between two NFs in 5G core network control plane (i.e., AMF 126 and SMF 127); example 2 (FIG. 4) is data transfer between UPF 125 and SMF 127; example 3 is data transfer between NEF 130 and AF 134, which may be a 3rd party AF.

As shown in FIG. 3, before the data consumer (i.e., SMF 127 in this example) sends a data request to the data provider (i.e., the AMF 126 in this example), AMF 126 may send a service registration message to NRF 131, which allows SMF 127 to discover AMF 126. After SMF 127 discovers AMF 126, SMF 127 sends the data request 312 to AMF 126, which then sends CIR 314 to DCM 190, which then queries MF 206 (see messages 316 and 318). In step s320, DCM 190 uses information contained in CIR 314 and/or information contained in query response 318 to select compression information, which DCM 190 then provides to AMF 126 (see response 322, which contains the selected compression information). AMF 126 then sends to SMF 127 response 324. Next, SMF 127 sends a subscribe request to AMF 126, which request may include the request identifier (rID) that was included in data request 312. In response to the subscribe request 326, AMF 126 obtains the requested data set (i.e., the data set identified by the dataID included in request 312), compresses the requested data set using the compression information received from DCM 190, and then sends the compressed data to SMF 127 (see message 328). SMF 127 then uses compression information selected by DCM 190 to decompress the compressed data (step 330).

Referring now to FIG. 5, in this example the DC (i.e., AF 134 in this example), rather than the DP (i.e., NEF 130 in this example) sends the CIR 514 to DCM 190 and DCM 190 send to AF 134 the CIR response 522. However, AF 134 could also contact DCM through NEF, as illustrated in FIG. 2. As shown in FIG. 5, DCM 190 also sends a message 524 to NEF 130, where message 524 includes compression information selected by DCM and the request id (rID) that was included in data request 512. After receiving message 524, NEF 130 transmits an ACK message 525 to AF 134. This ACK message includes the rID. This ACK message may also include some of the compression information that was included in message 524. For example, in a scenario where DCM 190 does not provide CIR response 522 to AF 134, the ACK 525 will include the compression information that is needed by AF 134 to decompress the compressed data generated by NEF 130 using the compression information selected by DCM 190. After receiving ACK 525, AF 130 sends an accept message 526 containing rID, which triggers NEF 130 to compress the data set requested by message 512, thereby producing the compressed data, and to send the compressed data to AF 134, which then decompresses the compressed data using the compression information selected by DCM 190. It is noted that, if AF 134 requests a data set that requires NEF 130 to obtain the data set (or a portion of the data set) from another other NF (e.g., AMF 126 or other NF), then the corresponding data transfer between NEF and other NFs is illustrated by FIG. 3.

SUMMARY OF VARIOUS EMBODIMENTS

Figure 6:
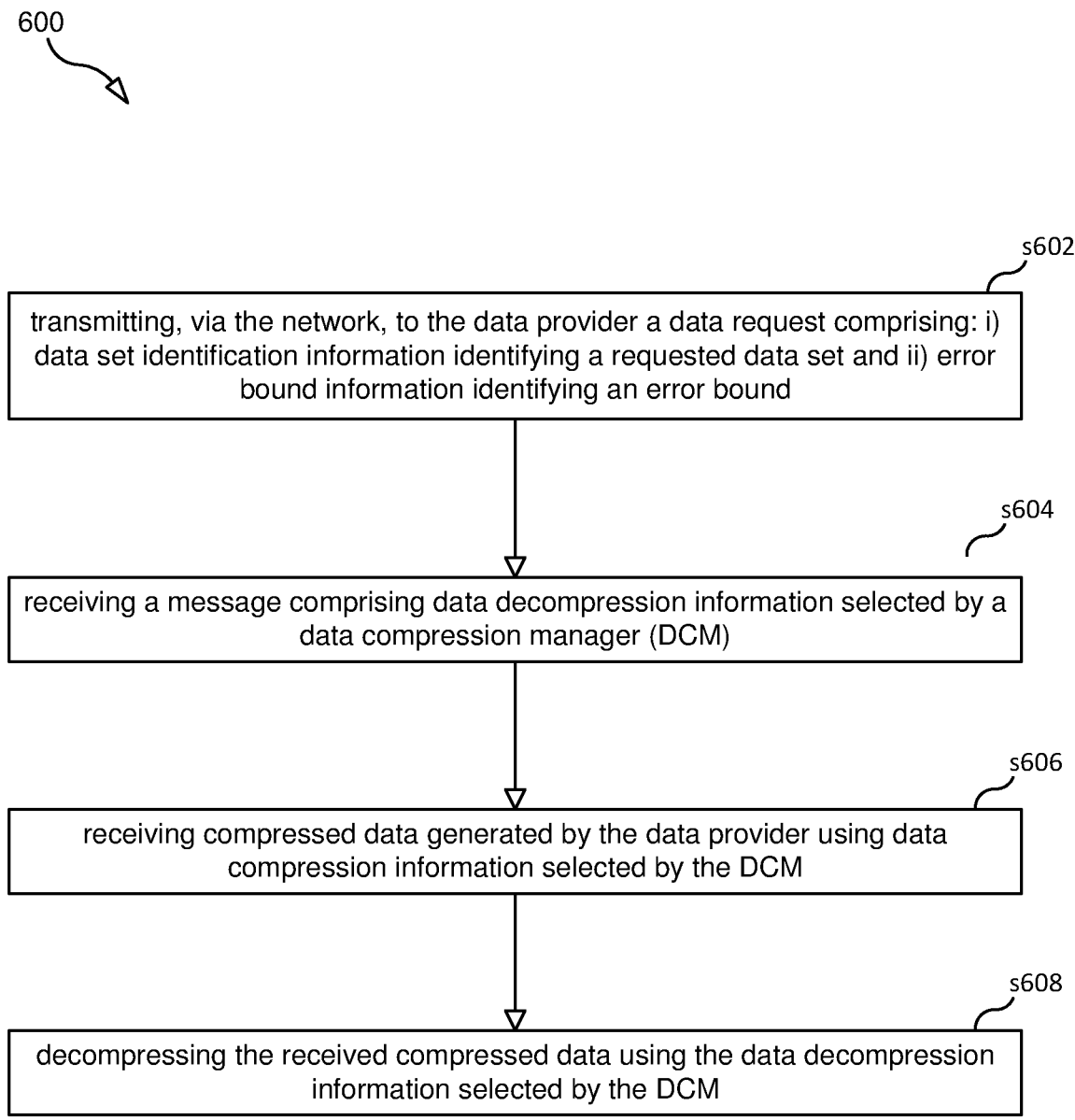
FIG. 6 is a flowchart illustrating a process according to some embodiments.

A1. A method (600, see FIG. 6) for reducing network traffic in a communication system comprising a data consumer, a data provider, and a network connecting the data consumer with the data provider, the method comprising: the data consumer transmitting (s602), via the network, to the data provider a data request comprising data set identification information identifying a requested data set (the data request may also include error bound information identifying an error bound); after transmitting the information to the data provider, the data consumer receiving (s604) a message comprising data decompression information selected by a data compression manager (DCM) based on the error bound information, information about the requested data set, and/or information included in a query response from a management function, wherein the DCM is separate from the data consumer; the data consumer receiving (s606) compressed data generated by the data provider using data compression information selected by the DCM, wherein the compressed data comprises a compressed version of the requested data set, and the data compression information was selected by the DCM based on the error bound, the information about the requested data set, and/or the information included in the query response from the management function; and the data consumer decompressing (s608) the received compressed data using the data decompression information selected by the DCM.

A2. The method of embodiment A1, wherein the DCM selected the data decompression information based on the error bound information and the information about the requested data set.

A3. The method of embodiment A2, wherein the information about the requested data set comprises or consists of a sample of the requested data set.

A4. The method of embodiment A2 or A3, wherein the DCM selected the data decompression information based further on network resource information.

A5. The method of any one of embodiments A1-A4, wherein the request transmitted by the data consumer further comprises a request identifier uniquely associated with the request; the data consumer receives the message comprising the data decompression information from the DCM, and the message comprising the data decompression information further comprises the request identifier.

A6. The method of any one of embodiments A1-A5, wherein the data consumer receives the message comprising the data decompression information from the data provider.

A7. The method of any one of embodiments A1-A6, wherein the compressed data was generated using a lossy compression algorithm.

A8. The method of any one of embodiments A1-A7, wherein the DCM is a component of the data provider, or the DCM is a first software component running on a first machine and the data provider is a second software component running on a second machine that is separate from the first machine.

Figure 7:
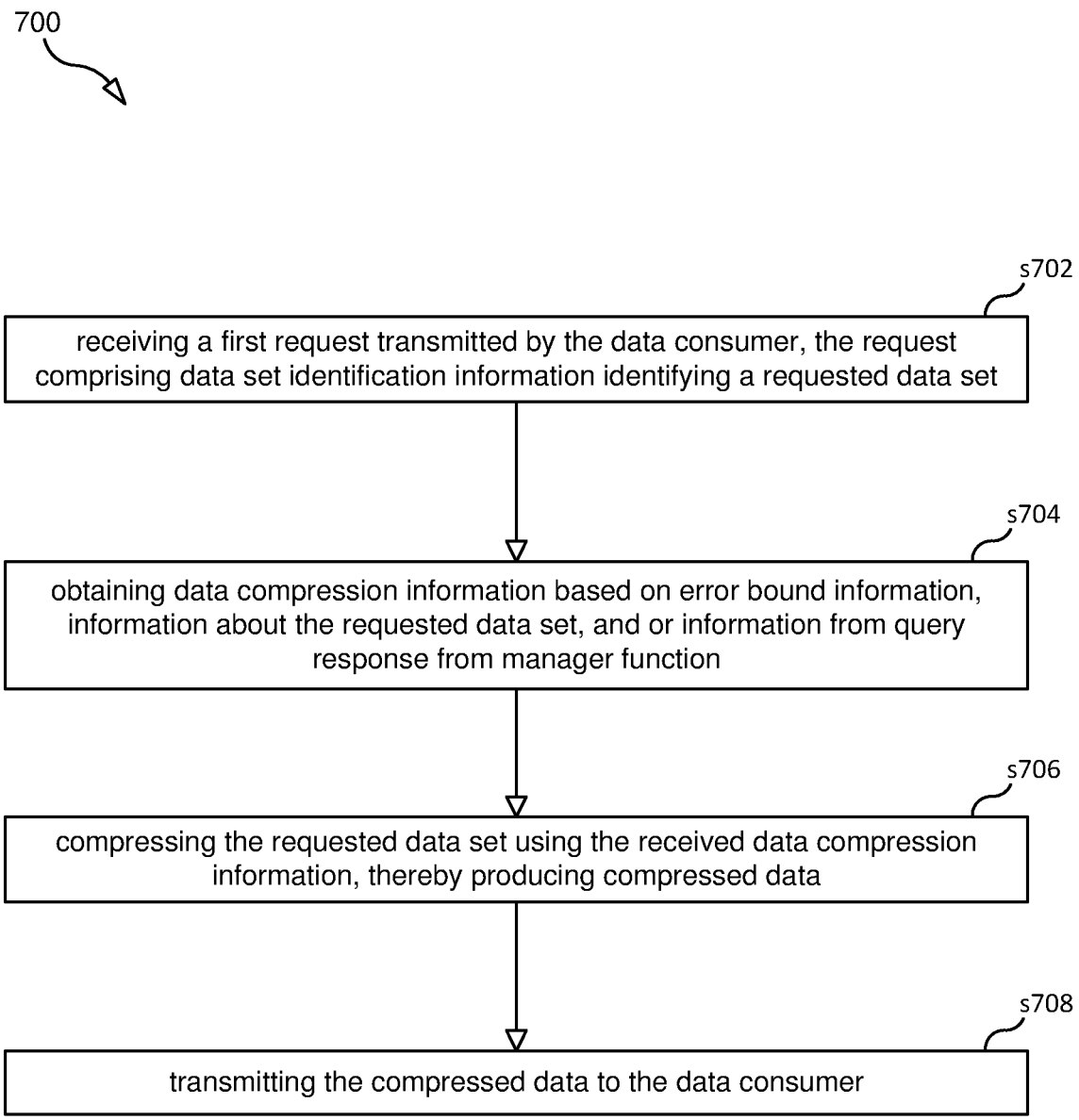
FIG. 7 is a flowchart illustrating a process according to some embodiments.

B1. A method (700, see FIG. 7) for reducing network traffic in a communication system comprising a data consumer, a data provider, and a network connecting the data consumer with the data provider, the method comprising: the data provider receiving (s702) a first request transmitted by the data consumer, the request comprising data set identification information identifying a requested data set (the request may also include error bound information identifying an error bound); after receiving the first request, the data provider obtaining (s704) data compression information based on the error bound information, information about the requested data set, and/or information included in a query response from a management function; after obtaining the data compression information, the data provider compressing (s706) the requested data set using the received data compression information, thereby producing compressed data; and the data provider transmitting (s708), via the network, to the data consumer the compressed data.

B2. The method of embodiment B1, wherein obtaining the data compression information comprises: the data provider providing to a data compression manager (DCM) a compression information request, CIR, comprising the error bound information and/or the information about the requested data set; and after providing to the DCM the CIR, the data provider receiving data compression information selected by the DCM based on the error bound, the information about the requested data set, and/or the information included in the query response from the management function.

B3. The method of embodiment B2, wherein the CIR comprises the information about the requested data set.

B4. The method of embodiment B3, wherein the information about the requested data set comprises or consists of a sample of the requested data set.

B5. The method of embodiment B3 or B4, wherein the DCM selected the data compression information based on the error bound and the information about the requested data set.

B6. The method of embodiment B3, B4 or B5, wherein the CIR further comprises information about the data provider.

B7. The method of embodiment B6, wherein the DCM selected the data compression information based on the error bound, the information about the requested data set, and the information about the data provider.

B8. The method of embodiment B3, B4 or B5, wherein the query response comprises network resource information, and the DCM selected the data compression information based on: i) the error bound, ii) the information about the requested data set, and iii) the network resource information.

B9. The method of any one of embodiments B1-B8, further comprising: after providing to the DCM the CIR, the data provider receiving data decompression information selected by the DCM; and the data provide transmitting to the data consumer the received data decompression information.

B10. The method of any one of embodiments B1-B9, wherein the data provider uses a lossy compression algorithm to compress the requested data set.

Figure 8:
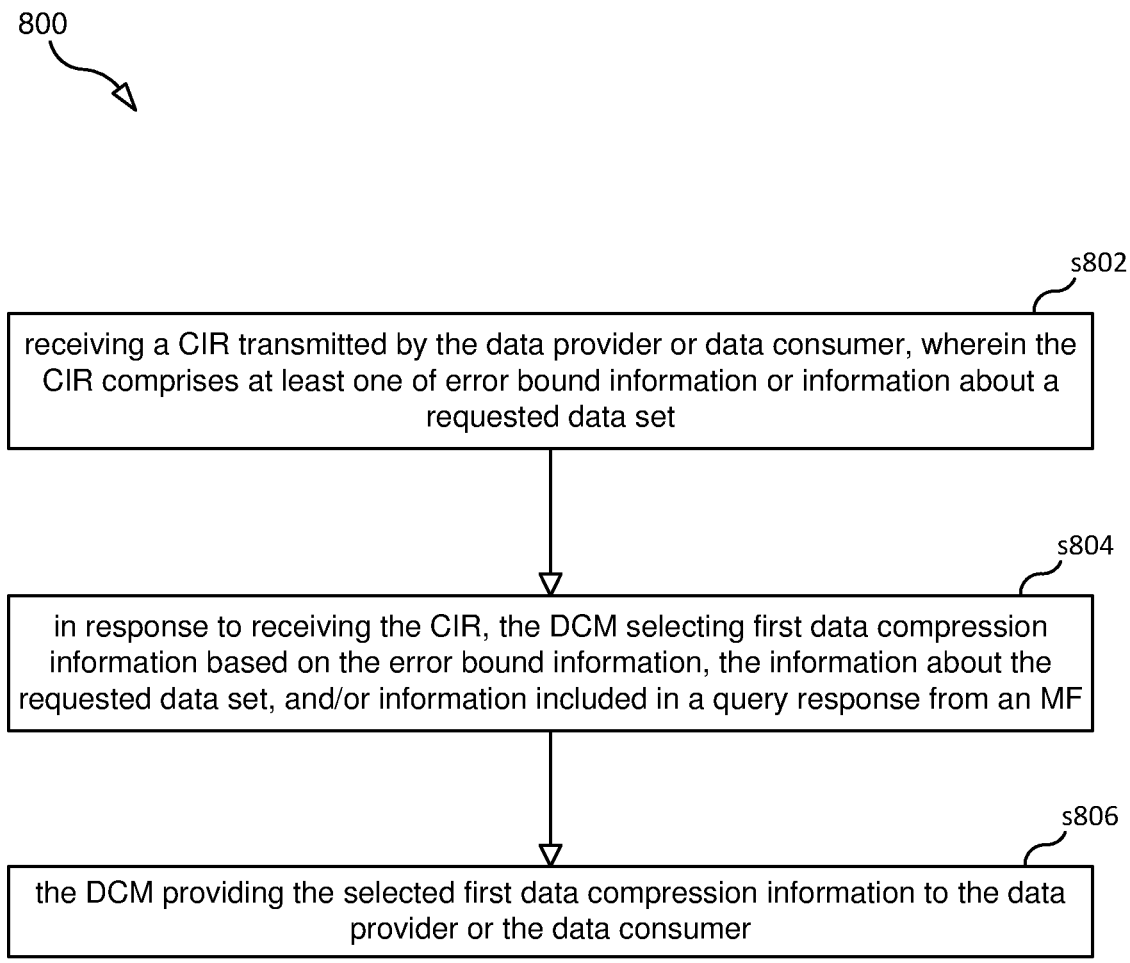
FIG. 8 is a flowchart illustrating a process according to some embodiments.

C1. A method (800, see FIG. 8) for reducing network traffic in a communication system comprising a data consumer, a data provider, a network connecting the data consumer with the data provider, and a data compression manager (DCM), the method comprising: the DCM receiving (s802) a compression information request, CIR, transmitted by the data provider or the data consumer, wherein the CIR comprises at least one of i) error bound information identifying an error bound or ii) information about a data set requested by the data consumer; in response to receiving the CIR, the DCM selecting (s804) first data compression information based on the error bound information, the information about the requested data set, and/or information included in a query response from a management function; and the DCM providing (s806) the selected first data compression information to the data provider or the data consumer.

C2. The method of embodiment C1, wherein the CIR comprises the error bound information and the information about the requested data set.

C3. The method of embodiment C2, wherein the information about the requested data set comprises or consists of a sample of the requested data set.

C4. The method of embodiment C2 or C3, wherein the DCM selects the first data compression information based on the error bound and the information about the requested data set.

C5. The method of embodiment C2, C3 or C4, wherein the CIR further comprises information about the data provider.

C6. The method of embodiment C5, wherein the DCM selects the first data compression information based on the error bound, the information about the requested data set, and the information about the data provider.

C7. The method of embodiment C2, C3 or C4, wherein the query response comprises network resource information, and the DCM selects the first data compression information based on: i) the error bound, ii) the information about the requested data set, and iii) the network resource information.

C8. The method of embodiment C7, wherein the network resource information comprises information indicating an amount of available network resources.

C9. The method of any one of embodiments C1-C8, wherein the data compression information comprises computer code that implements a compression algorithm.

C10. The method of any one of embodiments C1-C8, wherein the data compression information comprises compression parameters.

C11. The method of any one of embodiments C1-C10, wherein the CIR is transmitted by the data provider in response to the data provider receiving a data request transmitted by the data consumer, and the data request comprises the error bound information identifying the error bound.

C12. The method of any one of embodiments C1-C11, wherein the first data compression information consists of compression information for compressing data, and the method further comprises: the DCM selecting, based on the error bound information and/or the information about the requested data set, second data compression information that consists of compression information for decompressing data; and the DCM providing the second data compression information to the data consumer.

C13. The method of any one of embodiments C1-C11, wherein the DCM provides the selected first data compression information to the data provider, the first data compression information comprises compression information for compressing data and decompression information for decompressing data compressed using the compression information for compressing data, and the method further comprises the data provider providing the decompression information to the data consumer.

C14. The method of any one of embodiments C1-C11, wherein the DCM provides the selected first data compression information to the data consumer, the first data compression information comprises compression information for compressing data and decompression information for decompressing data compressed using the compression information for compressing data, and the method further comprises the data consumer providing to the data provider the compression information for compressing data.

D1. A computer program (943) comprising instructions (944) which when executed by processing circuitry (902) causes the processing circuitry (902) to perform the method of any one of the above embodiments.

D2. A carrier containing the computer program of embodiment D1, wherein the carrier is one of an electronic signal, an optical signal, a radio signal, and a computer readable storage medium (942).

Figure 10A:
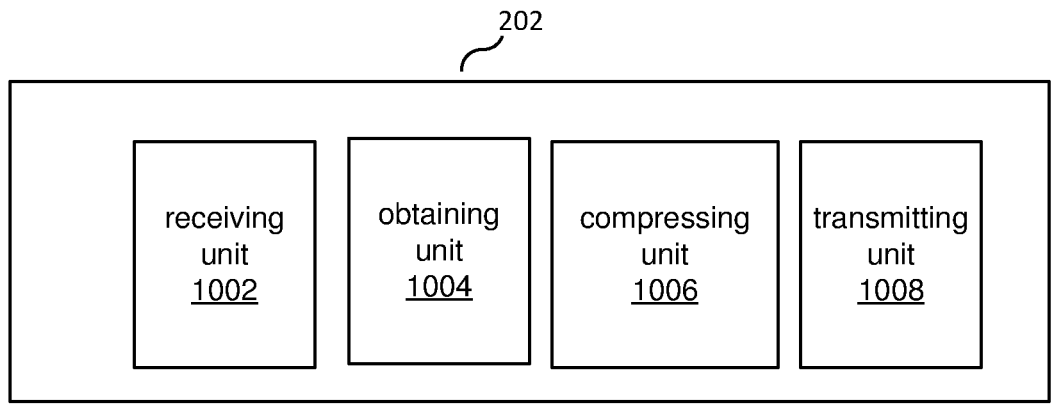
FIG. 10A is a block diagram of a DP according to some embodiments.
Figure 10B:
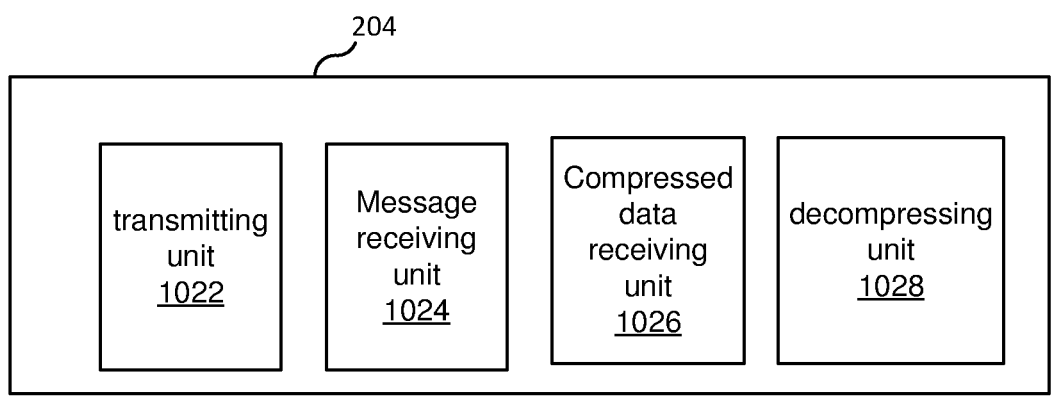
FIG. 10B is a block diagram of a DC according to some embodiments.

E1. A data consumer (204, see FIG. 10B), the data consumer comprising: a transmitting unit (1022) for transmitting, via a network, to a data provider a data request comprising: i) data set identification information identifying a requested data set and ii) error bound information identifying an error bound; a message receiving unit (1024) for receiving a message comprising data decompression information selected by a data compression manager (DCM) based on the error bound, wherein the DCM is separate from the data consumer; a compressed data receiving unit (1026) for receiving compressed data generated by the data provider using data compression information selected by the DCM, wherein the compressed data comprises a compressed version of the requested data set, and the data compression information was selected by the DCM based on the error bound; and a decompressing unit (1028) for decompressing the received compressed data using the data decompression information selected by the DCM.

F1. A data provider (202, see FIG. 10A), the data provider comprising: a receiving unit (1002) for receiving a first request transmitted by the data consumer, the request comprising: i) data set identification information identifying a requested data set and ii) error bound information identifying an error bound; an obtaining unit (1004) for obtaining data compression information based on the error bound information; a compressing unit (1006) for compressing the requested data set using the received data compression information, thereby producing compressed data; and a transmitting unit (1008) for transmitting, via the network, to the data consumer the compressed data.

Figure 10C:
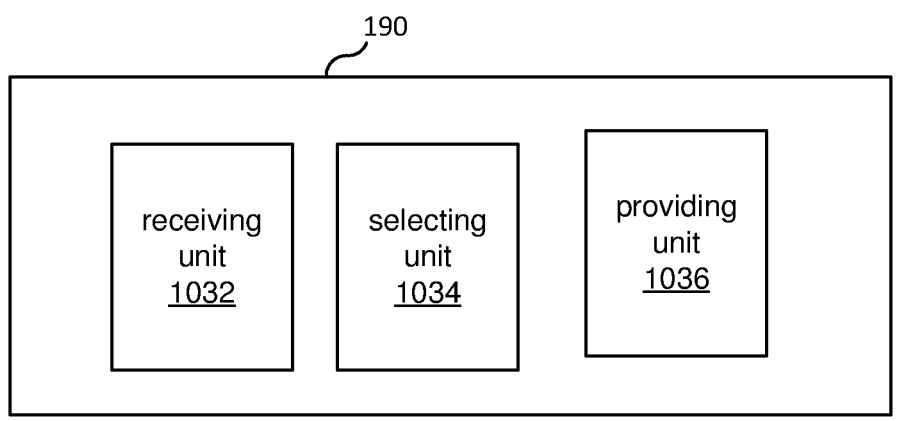
FIG. 10C is a block diagram of a DCM according to some embodiments.

G1. A data compression manager, DCM (109, see FIG. 10C), the DCM comprising: a receiving unit (1032) for receiving a compression information request, CIR, transmitted by the data provider or the data consumer, wherein the CIR comprises at least one of i) error bound information identifying an error bound or ii) information about a data set requested by the data consumer; a selecting unit (1034) for selecting, in response to receiving the CIR, first data compression information based on the error bound information and/or the information about the requested data set; and a providing unit (1036) for providing the selected first data compression information to the data provider or the data consumer.

H1. An apparatus (900), the apparatus being configured to perform the method of any one the above embodiments A1-A8, B1-B10, and C1-C14.

Figure 9:
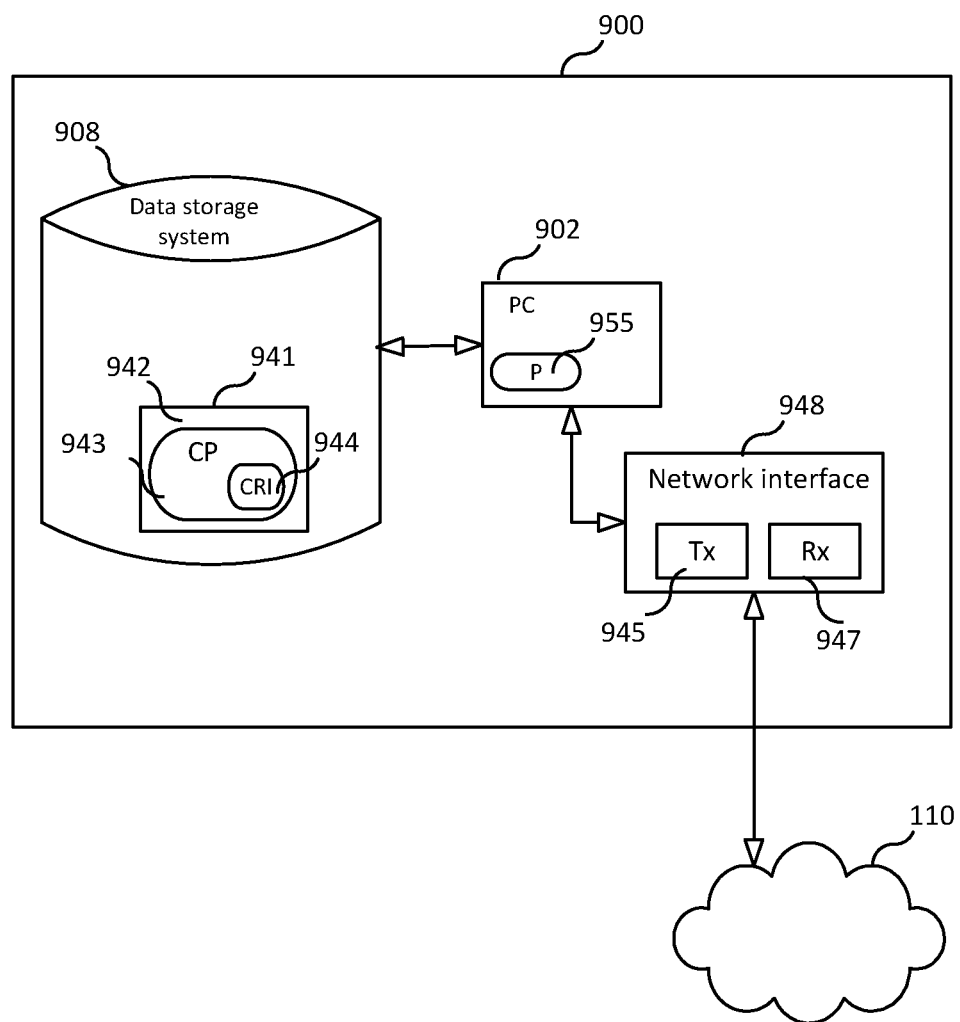
FIG. 9 is a block diagram of a physical machine according to some embodiments.

FIG. 9 is a block diagram of a phyiscal machine (or "apparatus") 900, according to some embodiments, which can be used to run any one of DCM 190, DP 202, and DC 204. As shown in FIG. 9, apparatus 900 may comprise: processing circuitry (PC) 902, which may include one or more processors (P) 955 (e.g., a general purpose microprocessor and/or one or more other processors, such as an application specific integrated circuit (ASIC), field-programmable gate arrays (FPGAs), and the like), which processors may be co-located in a single housing or in a single data center or may be geographically distributed (i.e., apparatus 900 may be a distributed computing apparatus); a network interface 948 comprising a transmitter (Tx) 945 and a receiver (Rx) 947 for enabling apparatus 900 to transmit data to and receive data from other machines connected to a network 110 (e.g., an Internet Protocol (IP) network) to which network interface 948 is connected (directly or indirectly) (e.g., network interface 948 may be wirelessly connected to the network 110, in which case network interface 948 is connected to an antenna arrangement); and a local storage unit (a.k.a., "data storage system") 908, which may include one or more non-volatile storage devices and/or one or more volatile storage devices. In embodiments where PC 902 includes a programmable processor, a computer program product (CPP) 941 may be provided. CPP 941 includes a computer readable medium (CRM) 942 storing a computer program (CP) 943 comprising computer readable instructions (CRI) 944. CRM 942 may be a non-transitory computer readable medium, such as, magnetic media (e.g., a hard disk), optical media, memory devices (e.g., random access memory, flash memory), and the like. In some embodiments, the CRI 944 of computer program 943 is configured such that when executed by PC 902, the CRI causes apparatus 900 to perform steps described herein (e.g., steps described herein with reference to the flow charts). In other embodiments, apparatus 900 may be configured to perform steps described herein without the need for code. That is, for example, PC 902 may consist merely of one or more ASICs. Hence, the features of the embodiments described herein may be implemented in hardware and/or software.

While various embodiments are described herein, it should be understood that they have been presented by way of example only, and not limitation. Thus, the breadth and scope of this disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

The invention claimed is:

1. A method for reducing network traffic in a communication system comprising a data consumer, a data provider, and a network connecting the data consumer with the data provider, the method comprising:
the data consumer transmitting, via the network, to the data provider a data request comprising data set identification information identifying a requested data set;
as a result of transmitting the data request to the data provider, the data consumer receiving a message comprising data decompression information selected by a data compression manager (DCM) based on: i) error bound information that identifies an error bound, ii) information about the requested data set, and/or iii) information included in a query response from a management function, wherein the DCM is separate from the data consumer;
the data consumer receiving compressed data generated by the data provider using data compression information selected by the DCM, wherein the compressed data comprises a compressed version of the requested data set, and the data compression information was selected by the DCM based on the error bound, the information about the requested data set, and/or the information included in the query response from the management function; and
the data consumer decompressing the received compressed data using the data decompression information selected by the DCM.

2. The method of claim 1, wherein
the data request further comprises the error bound information,
the error bound information specifies an error percentage indicating a maximum tolerated error;
the DCM selected the data decompression information based on the specified error percentage and the information about the requested data set,
the information about the requested data set comprises or consists of a sample of the requested data set, and
the DCM selected the data decompression information based further on network resource information.

3. The method of claim 1, wherein
the request transmitted by the data consumer further comprises a request identifier uniquely associated with the request;
the data consumer receives the message comprising the data decompression information from the DCM, and
the message comprising the data decompression information further comprises the request identifier.

4. The method of claim 1, wherein
the data consumer receives the message comprising the data decompression information from the data provider, and
the DCM is a component of the data provider or the DCM is a first software component running on a first machine and the data provider is a second software component running on a second machine that is separate from the first machine.

5. A method for reducing network traffic in a communication system comprising a data consumer, a data provider, and a network connecting the data consumer with the data provider, the method comprising:
the data provider receiving a data request transmitted by the data consumer, the data request comprising data set identification information identifying a requested data set;
after receiving the data request, the data provider obtaining data compression information based on: i) error bound information identifying an error bound, ii) information about the requested data set, and/or iii) information included in a query response from a management function;
after obtaining the data compression information, the data provider compressing the requested data set using the received data compression information, thereby producing compressed data; and
the data provider transmitting, via the network, to the data consumer the compressed data.

6. The method of claim 5, wherein obtaining the data compression information comprises:
the data provider providing to a data compression manager (DCM) a compression information request (CIR) comprising the error bound information and/or the information about the requested data set; and
after providing to the DCM the CIR, the data provider receiving data compression information selected by the DCM based on the error bound, the information about the requested data set, and/or the information included in the query response from the management function.

7. The method of claim 6, wherein
the CIR comprises the information about the requested data set,
the information about the requested data set comprises or consists of a sample of the requested data set,
the DCM selected the data compression information based on the error bound and the information about the requested data set, the CIR further comprises information about the data provider, and the DCM selected the data compression information based on the error bound, the information about the requested data set, and the information about the data provider.

8. The method of claim 7, wherein the query response comprises network resource information, and the DCM selected the data compression information based on: i) the error bound, ii) the information about the requested data set, and iii) the network resource information.

9. The method of claim 5, further comprising:

after providing to the DCM the CIR, the data provider receiving data decompression information selected by the DCM; and transmitting to the data consumer the received data decompression information.

10. A method for reducing network traffic in a communication system comprising a data consumer, a data provider, a network connecting the data consumer with the data provider, and a data compression manager (DCM), the method comprising:

the DCM receiving a compression information request (CIR) requesting the DCM to select compression information, wherein the CIR comprises: i) error bound information identifying an error bound and/or ii) information about a data set requested by the data consumer;

in response to receiving the CIR, the DCM selecting first data compression information based on the error bound information, the information about the requested data set, and/or information included in a query response from a management function; and the DCM providing the selected first data compression information to the data provider or the data consumer.

11. The method of claim 10, wherein the CIR comprises the error bound information and the information about the requested data set, the error bound information specifies an error percentage indicating a maximum tolerated error;

the information about the requested data set comprises or consists of a sample of the requested data set, and the DCM selects the first data compression information based on the specified error percentage and the information about the requested data set.

12. The method of claim 11, wherein the CIR further comprises information about the data provider, and the DCM selects the first data compression information based on the error bound, the information about the requested data set, and the information about the data provider.

13. The method of claim 11, wherein the query response comprises network resource information, the DCM selects the first data compression information based on: i) the error bound, ii) the information about the requested data set, and iii) the network resource information, and the network resource information comprises information indicating an amount of available network resources.

14. The method of claim 10, wherein the data compression information comprises computer code that implements a compression algorithm.

15. The method of claim 10, wherein the CIR is transmitted by the data provider in response to the data provider receiving a data request transmitted by the data consumer, and the data request comprises the error bound information identifying the error bound.

16. The method of claim 10, wherein the first data compression information consists of compression information for compressing data, and the method further comprises:

the DCM selecting, based on the error bound information and/or the information about the requested data set, second data compression information that consists of compression information for decompressing data; and the DCM providing the second data compression information to the data consumer.

17. The method of claim 10, wherein the DCM provides the selected first data compression information to the data provider, the first data compression information comprises compression information for compressing data and decompression information for decompressing data compressed using the compression information for compressing data, and the method further comprises the data provider providing the decompression information to the data consumer.

18. The method of claim 10, wherein the DCM provides the selected first data compression information to the data consumer, the first data compression information comprises compression information for compressing data and decompression information for decompressing data compressed using the compression information for compressing data, and the method further comprises the data consumer providing to the data provider the compression information for compressing data.

19. A non-transitory computer readable medium storing a computer program comprising instructions which when executed by processing circuitry of an apparatus causes the apparatus to perform the method of claim 1.

20. An apparatus, the apparatus comprising:

memory; and processing circuitry coupled to the memory, wherein the apparatus is configured to:

transmit, via a network, to a data provider a data request comprising data set identification information identifying a requested data set;

as a result of transmitting the data request to the data provider, receive a message comprising data decompression information selected by a data compression manager (DCM) based on: i) error bound information that identifies an error bound, ii) information about the requested data set, and/or iii) information included in a query response from a management function;

receive compressed data generated by the data provider using data compression information selected by the DCM, wherein the compressed data comprises a compressed version of the requested data set, and the data compression information was selected by the DCM based on the error bound, the information about the requested data set, and/or the information included in the query response from the management function; and decompress the received compressed data using the data decompression information selected by the DCM.

* * * * *